United States Patent
Kim et al.

(10) Patent No.: US 6,855,978 B2
(45) Date of Patent: Feb. 15, 2005

(54) GATE-CONTACT STRUCTURE AND METHOD FOR FORMING THE SAME

(75) Inventors: Sun-Young Kim, Kyunggi-do (KR); Woon-Kyung Lee, Kyunggi-do (KR); Dong-Whee Kwon, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/299,535

(22) Filed: Nov. 18, 2002

(65) Prior Publication Data

US 2003/0100172 A1 May 29, 2003

(30) Foreign Application Priority Data

Nov. 29, 2001 (KR) .................................. 10-2001-0074862

(51) Int. Cl.[7] .............................................. H01L 29/788
(52) U.S. Cl. ........................ 257/316; 257/315; 257/368
(58) Field of Search ................................ 257/316, 315, 257/368, 296, 758

(56) References Cited

U.S. PATENT DOCUMENTS

| | | | | |
|---|---|---|---|---|
| 5,483,094 A | * | 1/1996 | Sharma et al. ............... | 257/316 |
| 5,650,648 A | * | 7/1997 | Kapoor ........................ | 257/316 |
| 6,057,193 A | * | 5/2000 | Wang et al. ................. | 438/266 |
| 6,417,539 B2 | * | 7/2002 | Gardner et al. ............. | 257/316 |
| 6,501,122 B1 | * | 12/2002 | Chan et al. .................. | 257/315 |
| 6,524,868 B2 | * | 2/2003 | Choi et al. ...................... | 438/3 |

* cited by examiner

Primary Examiner—Eddie Lee
Assistant Examiner—Douglas W. Owens
(74) Attorney, Agent, or Firm—Marger Johnson & McCollom, P.C.

(57) ABSTRACT

A gate-contact structure and a method for forming the same are provided. The structure includes a device isolation layer pattern formed at a semiconductor substrate to define an active region; and a gate electrode and a capping pattern, which are sequentially stacked on the semiconductor substrate across the device isolation layer pattern. The capping pattern includes a first gate contact hole that exposes a top surface of the gate electrode. An interlayer insulation layer pattern including a second gate contact hole is disposed to cover an entire surface of the semiconductor substrate including the gate electrode and the capping pattern. The second gate contact hole penetrates the first gate contact hole to expose the top surface of the gate electrode. A gate contact plug is disposed to be connected to the top surface of the gate electrode through the second gate contact hole. Accordingly, the interlayer insulation layer pattern is intervened between the gate contact plug and a sidewall of the capping pattern.

8 Claims, 20 Drawing Sheets

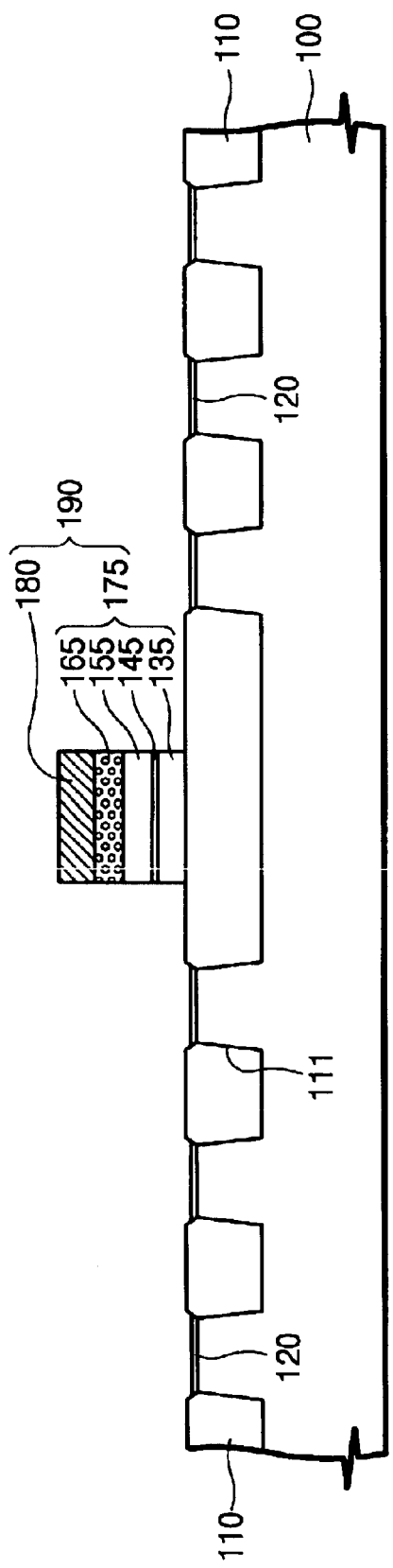

GATE-CONTACT STRUCTURE AND METHOD FOR FORMING THE SAME

CROSS REFERENCE TO RELATED APPLICATIONS

This application relies for priority upon Korean Patent Application No. 2001-74862, filed on Nov. 29, 2001, the contents of which are herein incorporated by reference in their entirety.

BACKGROUND OF THE INVENTION

1. Technical Field of the Invention

The present invention relates to a semiconductor device and a method for forming the same and, more particularly, to a gate-contact structure and a method for forming the same.

2. Description of Related Art

As an integration level of semiconductor devices increases, a structure in which there is no space between a contact plug and a device isolation layer pattern, normally called "a borderless contact structure", is being widely used. The method for forming the semiconductor device including the borderless contact structure comprises forming an etch stop layer on the device isolation layer pattern. Thus, when patterning an interlayer insulation layer for forming a contact hole, the device isolation layer pattern is not etched.

Meanwhile, the conventional method for forming a gate electrode of the semiconductor device comprises patterning a gate conductive layer formed on a semiconductor substrate using a photoresist pattern. However, as semiconductor devices gradually become highly integrated, it grows increasingly difficult to minutely form a width of the gate electrode, especially when the gate electrode of a flash memory device has a structure in which various kinds of material layers are sequentially stacked. To solve the foregoing problem, a method for forming the flash memory device includes forming a capping pattern on the gate conductive layer, then etching the gate conductive layer using the capping pattern as an etch mask.

FIGS. 1 and 2 are top plan views illustrating a method of forming a gate-contact structure for a NOR-type nonvolatile memory device according to a conventional method. FIGS. 3A through 3C and 4A through 4C are cross-sectional views illustrating a method for forming the gate-contact structure of the NOR-type nonvolatile memory device according to the conventional method. FIGS. 3A through 3C are the cross-sectional views taken along lines 1–1', 2–2', and 3–3' of FIG. 1, respectively, and FIGS. 4A through 4C are the cross-sectional views taken along lines 1–1', 2–2', and 3–3' of FIG. 2, respectively.

Referring to FIGS. 1 and 3A through 3C, a plurality of device isolation layer patterns 12 are formed at a semiconductor substrate 10 to define an active region 70. A gate oxide layer 14 is formed on the active region 70. A gate conductive layer (not shown) and a capping pattern 28 are sequentially stacked on the semiconductor substrate including the gate oxide layer 14. In this case, the capping pattern 28 is formed to cross the active region 70 as well as the device isolation layer pattern 12. By using the capping pattern 28 as an etch mask, the gate conductive layer is patterned to form a gate electrode 20. Thus, the gate electrode 20 and the capping pattern 28, which are sequentially stacked, constitute a gate pattern 30. In case of a cell transistor used for the flash memory device, the gate electrode 20 is preferably formed of polysilicon, a gate interlayer insulation layer, polysilicon, and silicide, which are sequentially stacked.

A photoresist layer is formed on an entire surface of the semiconductor substrate including the gate pattern 30. The photoresist layer is patterned to form a photoresist pattern 40, which has an opening 42 exposing the device isolation layer pattern 12 disposed at one side of the gate pattern 30. The photoresist pattern 40 covers the device isolation layer pattern 12 at the other side of the gate pattern 30 where the opening 42 is not formed. By using the photoresist pattern 40 as an etch mask, the exposed device isolation layer pattern 12 is removed to expose the semiconductor substrate 10.

Referring to FIGS. 2 and 4A through 4C, after removing the photoresist pattern 40, an ion implantation process is performed by using the gate pattern 30 as an ion implantation mask, thereby forming a common source junction region 82 and a drain junction region 80 in the semiconductor substrate 10. At this time, another photoresist pattern may be used as the ion implantation mask together with the gate pattern 30. The common source junction region 82 is formed in the semiconductor substrate 10 exposed by removing the active region 70 as well as the device isolation layer pattern 12. The drain junction region 80 is formed in the active region 70 covered with the photoresist pattern 40.

An etch stop layer 50 and an interlayer insulation layer 60 are sequentially stacked on an entire surface of the semiconductor substrate including the junction regions 80 and 82. The interlayer insulation layer 60 and the etch stop layer 50 are patterned to form a gate contact hole 64 and a junction region contact hole 62. The gate contact hole 64 and the junction region contact hole 62 expose top surfaces of the gate pattern 30 and the drain junction region 80, respectively.

As described above, the etch stop layer 50 is a material layer that is required for forming the borderless contact structure. That is, the etch stop layer 50 is used to prevent the device isolation layer pattern 12 from being etched during etching of the interlayer insulation layer 60. At this time, the capping pattern 28 of a lower part of the gate contact hole 64 still covers the gate electrode 20. Thus, it is necessary to perform an additional process for etching the capping pattern 28 so as to form a capping contact hole 66 exposing a top surface of the gate electrode 20. Otherwise, the semiconductor device may suffer a serious problem because it is difficult to apply an operating voltage to the gate electrode 20.

However, in case the additional etch process is performed, since the etch stop layer 50 was etched in the junction region contact hole 62, the drain junction region 80 is recessed. Besides, in case the semiconductor device has the borderless contact structure as described above, the additional etch process of the silicon oxide layer leads to etching of the device isolation layer pattern 112 exposed through the junction region contact hole 62. As a result, there arises a dent 99, as illustrated by the dotted circle. The dent 99 may cause a leakage current to flow through the drain junction region 80. To prevent the dent 99, the gate contact hole 64 and the junction region contact hole 62 may be separately formed. This is undesirable from both a process simplification and reduction of fabrication costs perspective.

SUMMARY OF THE INVENTION

It is therefore a feature of the present invention to provide a method for forming a gate-contact structure, which can form both a gate contact hole and a contact hole simultaneously, without causing damage to a junction region or a device isolation layer pattern.

It is another feature of the present invention to provide a gate-contact structure, which can prevent a leakage current in the junction region.

The present invention provides a method for forming a gate-contact structure that comprises etching a capping pattern before forming a gate contact hole in an interlayer insulation layer. The method comprises forming a device isolation layer pattern at a semiconductor substrate to define an active region. Thereafter, a gate electrode and a capping pattern are sequentially stacked on the semiconductor substrate where the device isolation layer pattern is formed, across the device isolation layer pattern and the active region. A first gate contact hole is then formed to penetrate the capping pattern such that a predetermined region of the gate electrode is exposed. An interlayer insulation layer is formed on an entire surface of the resultant structure where the first gate contact hole is formed. The interlayer insulation layer is then patterned to form an interlayer insulation layer pattern having a second gate contact hole. At this time, the second gate contact hole penetrates the first gate contact hole to expose a top surface of the gate electrode.

Preferably, forming the gate electrode and the capping pattern comprises sequentially stacking a gate conductive layer, a capping insulation layer, and a photoresist pattern on the semiconductor substrate including the device isolation layer pattern. In this case, the photoresist pattern is preferably formed to cross the device isolation layer pattern and the active region. By using the photoresist pattern as an etch mask, the capping insulation layer is etched using an anisotropic etch process to form a capping pattern. Thereafter, the photoresist pattern is preferably removed. It is preferable that, by using the capping pattern as an etch mask, the gate conductive layer is then etched using an anisotropic etch process to form a gate electrode.

The gate electrode consists of a floating gate, a gate interlayer insulation layer, a lower control electrode, and an upper control electrode, which are sequentially stacked, and serve as a gate electrode for a nonvolatile memory device. The capping pattern is preferably composed of a silicon oxide layer.

Forming the first gate contact hole preferably comprises etching simultaneously the device isolation layer patterns disposed at one side of the gate electrode.

The interlayer insulation layer is preferably formed of first and second insulation layers, which are sequentially stacked. At this time, the first insulation layer is preferably a material layer having an etch selectivity with respect to the second insulation layer.

To realize process simplification, forming the interlayer insulation layer pattern preferably comprises forming a junction region contact hole exposing the active region and, at the same time, forming the second gate contact hole. In this case, the second gate contact hole is formed to have a smaller width than the first gate contact hole. In addition, patterning the interlayer insulation layer preferably employs an etch recipe having an etch selectivity with respect to the device isolation layer pattern as well as the active region.

The present invention also provides a gate-contact structure in which an interlayer insulation layer is arranged between a gate contact plug and a sidewall of a capping pattern. The structure comprises a device isolation layer pattern formed at a semiconductor substrate to define an active region, and a gate electrode disposed on the semiconductor substrate across the device isolation layer pattern as well as the active region. A capping pattern, which includes a first gate contact hole exposing a predetermined region of the gate electrode, is disposed on the gate electrode. An interlayer insulation layer pattern having a second gate contact hole is disposed to cover the gate electrode and the capping pattern. The second gate contact hole penetrates the first gate contact hole to expose a top surface of the gate electrode. In addition, a gate contact plug is connected to the top surface of the gate electrode through the second gate contact hole. Thus, the interlayer insulation layer is arranged between the gate contact plug and the sidewall of the capping pattern.

It is preferable that the interlayer insulation layer pattern is formed of first and second insulation layer patterns. At this time, the first insulation layer pattern is preferably a material layer having an etch selectivity with respect to the second insulation layer pattern.

Preferably, a common source junction region is disposed at one side of the gate electrode. In addition, the gate electrode is preferably a gate electrode of a nonvolatile memory device that includes a floating electrode, a gate interlayer insulation layer pattern, a lower control electrode, and an upper control electrode, which are sequentially stacked.

BRIEF DESCRIPTION OF THE DRAWINGS

FIGS. 9A through 13A, 9B through 13B, and 9C through 13C are cross-sectional views illustrating the method for forming the gate-contact structure according to the preferred embodiment of the present invention.

DETAILED DESCRIPTION OF THE INVENTION

Figure 1:
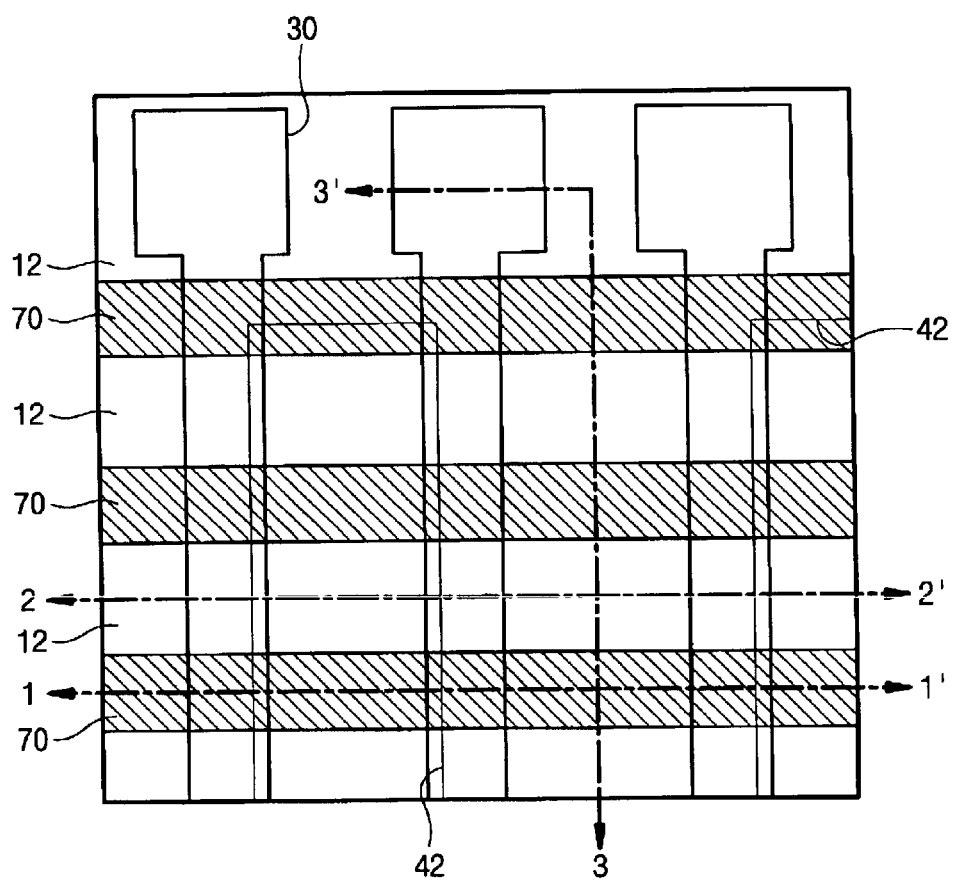
FIGS. 1 and 2 are top plan views illustrating a method for forming a gate-contact structure according to a conventional method.
Figure 2:
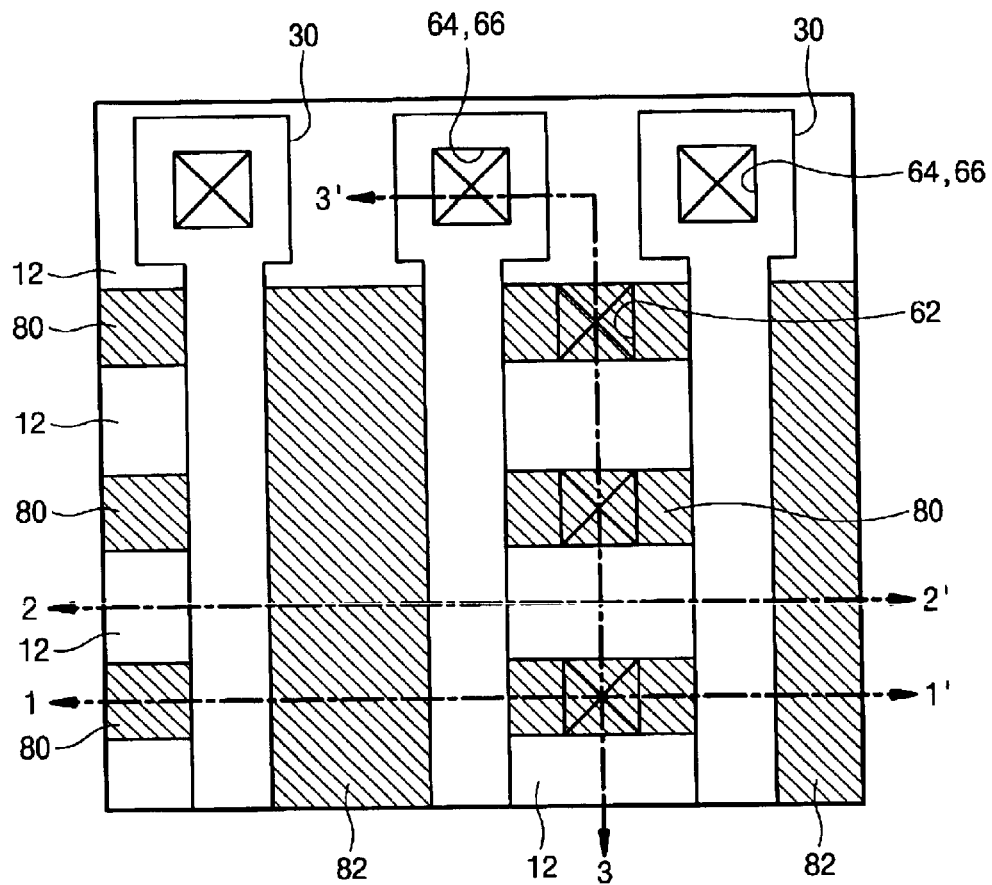
Figure 3A:
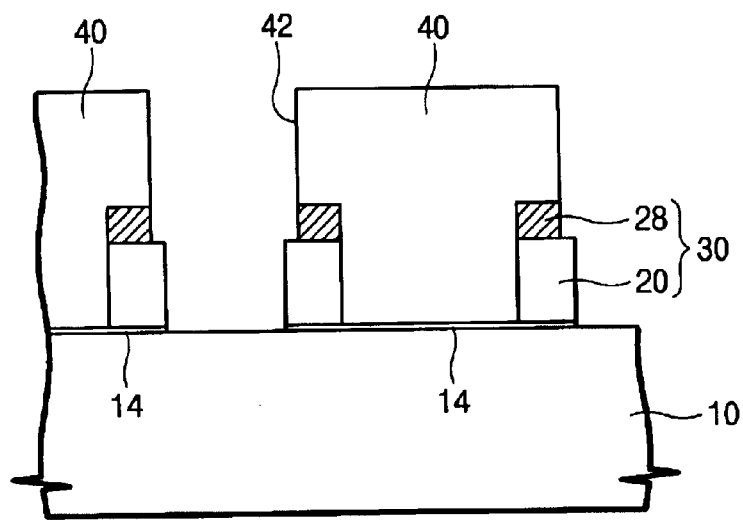
FIGS. 3A through 3C and 4A through 4C are cross-sectional views illustrating the method for forming the gate-contact structure according to the conventional method.
Figure 3B:
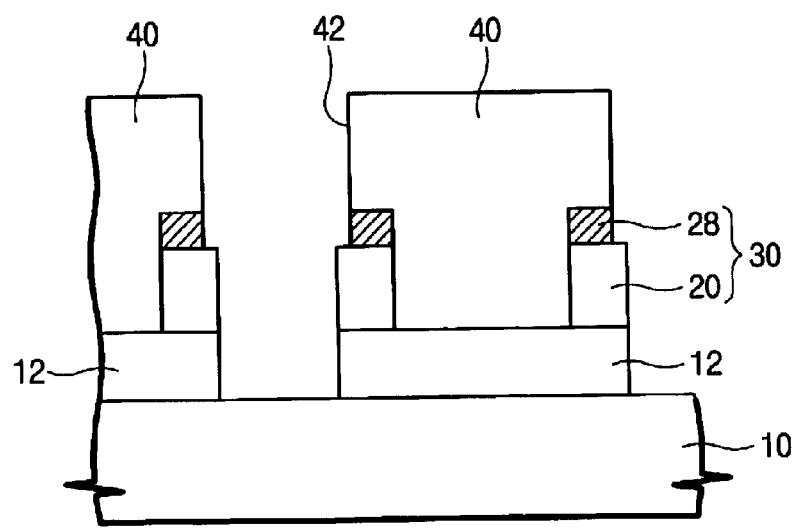
Figure 3C:
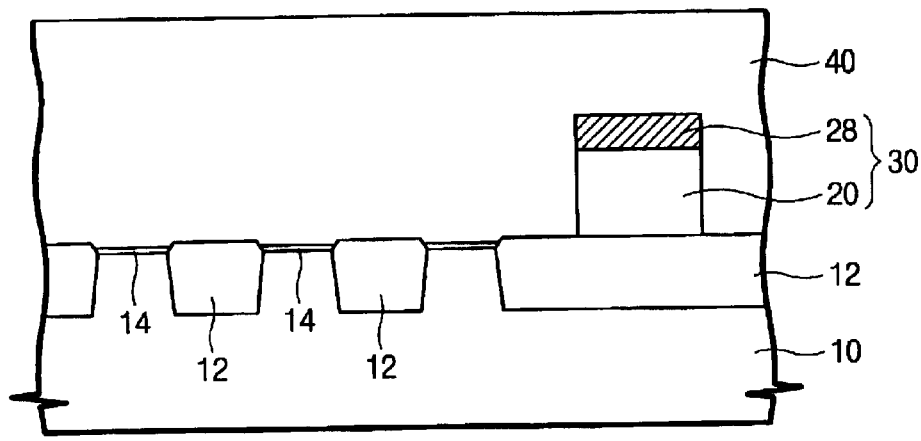
Figure 4A:
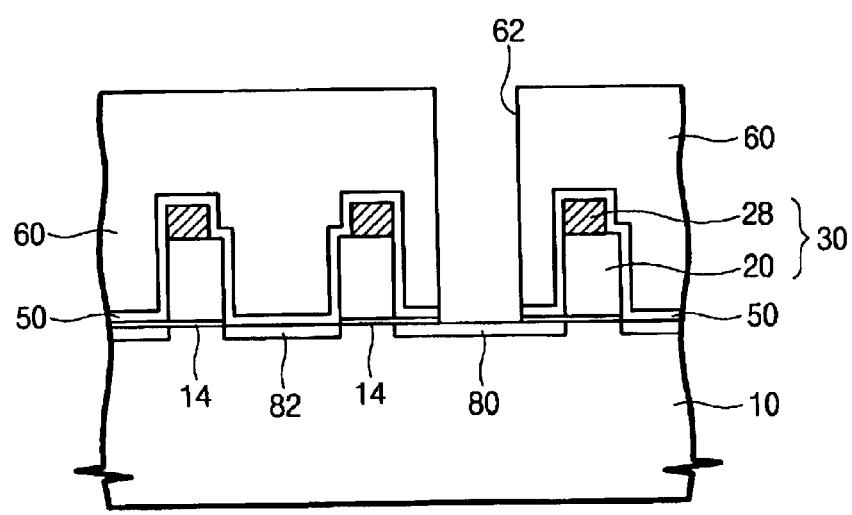
Figure 4B:
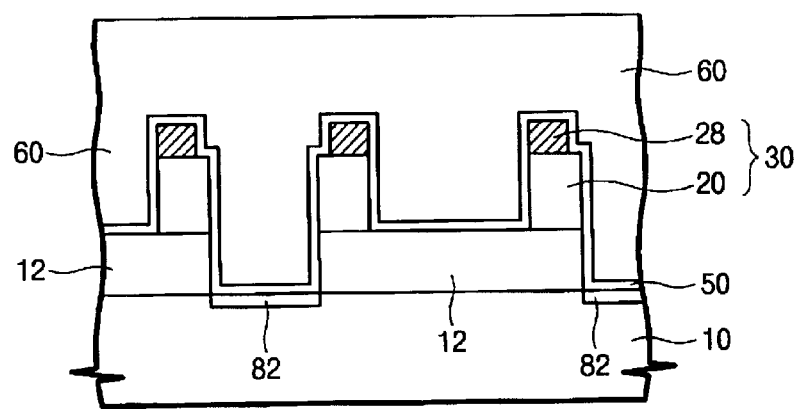
Figure 4C:
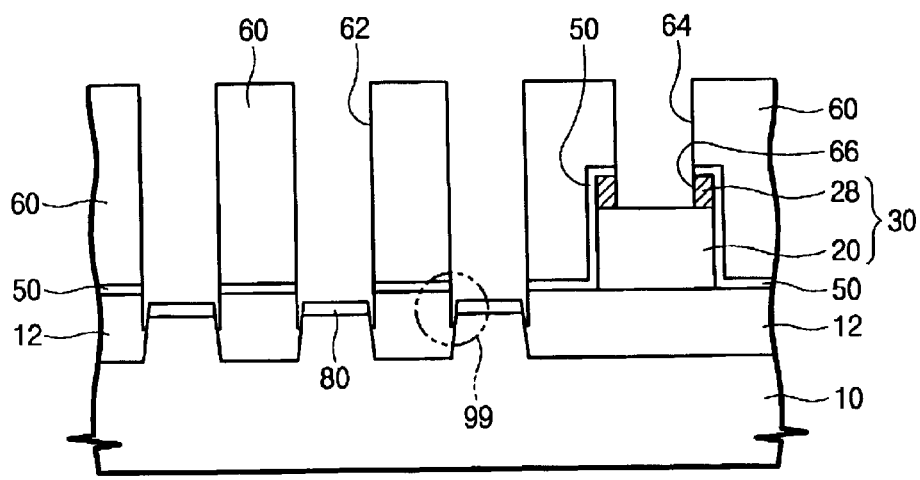
Figure 5:
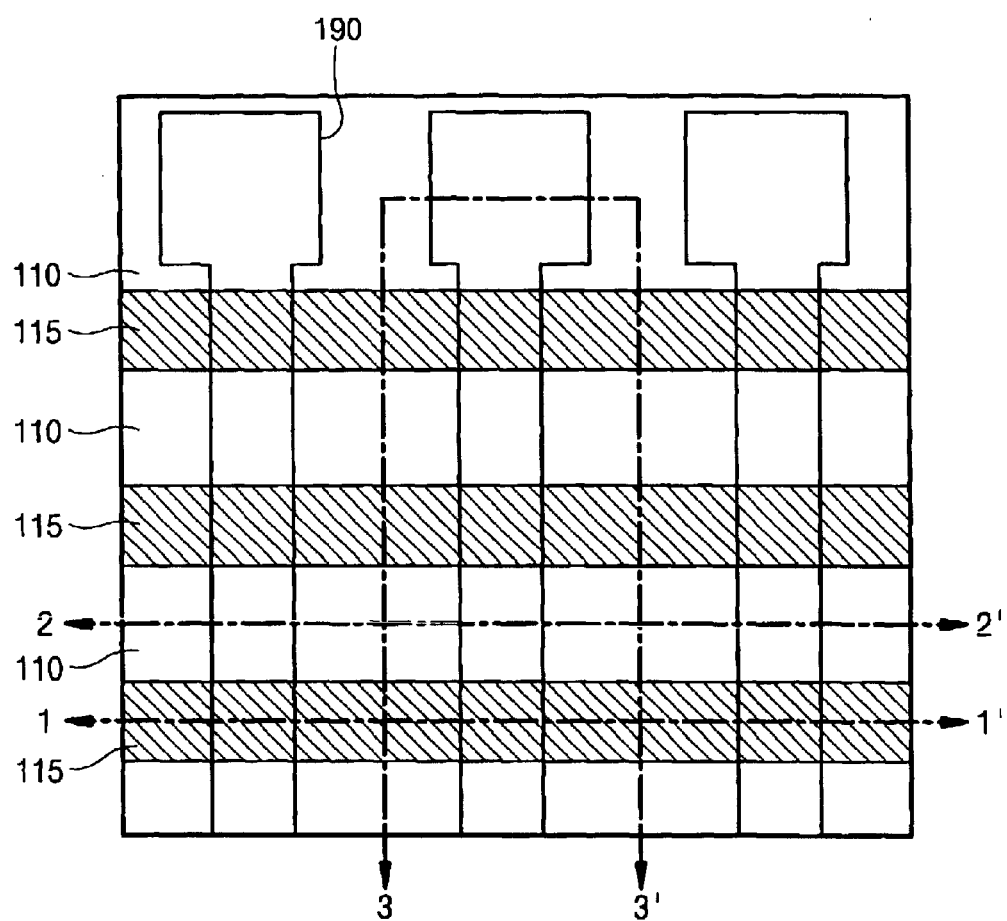
FIGS. 5 through 8 are top plan views illustrating a method for forming a gate-contact structure according to a preferred embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 5 through 8 are top plan views illustrating a method for forming a gate-contact structure of a NOR-type nonvolatile memory device according to a preferred embodiment of the present invention. FIGS. 9A through 13A, 9B through 13B, and 9C through 13C are cross-sectional views illustrating the method for forming the gate-contact structure of the NOR-type nonvolatile memory device according to a preferred embodiment of the present invention. At this time, FIGS. 9A through 13A, 9B through 13B, and 9C through 13C are the cross-sectional views taken along lines 1–1', 2–2', and 3–3' of FIGS. 5 to 8, respectively.

Referring to FIGS. 5 and 9A through 9C, a plurality of trenches 111 are formed in a semiconductor substrate 100. Forming the trench 111 preferably comprises forming a trench mask pattern (not shown), exposing a predetermined region of the semiconductor substrate 100, then performing a dry etch process using the trench mask pattern as an etch mask. In this case, it is preferable that an upper part of the trench 111 have a larger width than a lower part of the trench 111.

Annealing may be additionally performed to cure etching damages caused by etching the trenches 111. As the result of the annealing, a thermal oxide layer (not shown) is formed on an inner wall of the trench 111. Further, a silicon nitride layer liner (not shown) covering the inner wall of the trench 111 may be additionally formed in order to prevent oxygen and impurities from penetrating into the semiconductor substrate 100 through the trench 111.

Forming a device isolation layer pattern 110 filling the trench 111 comprises forming a device isolation layer on an entire surface of the semiconductor substrate including the trench 111, then etching the device isolation layer using a planarizing etch process until the trench mask pattern is exposed. The device isolation layer pattern 110 is preferably a silicon oxide layer. Thereafter, the trench mask pattern is removed to expose a top surface of the active region 115. A gate oxide layer 120 is formed on the exposed active region 115. The gate oxide layer 120 is preferably a thermal oxide layer obtained by a thermal process.

Thereafter, a gate conductive layer 170 and a capping insulation layer are formed on an entire surface of the semiconductor substrate including the gate oxide layer 120. The gate conductive layer 170 is preferably a multi-layered conductive material layer including polysilicon. Especially in a cell area of the nonvolatile memory device, the gate conductive layer 170 comprises a lower polysilicon layer 130, a gate interlayer insulation layer 140, an upper polysilicon layer 150, and a silicide layer 160, which are sequentially stacked. The gate interlayer insulation layer 140 is preferably made of oxide-nitride-oxide (ONO). In addition, to fabricate transistors used in a peripheral circuit region of the nonvolatile memory device, forming the gate conductive layer 170 may further comprise removing the gate interlayer insulation layer 140 and the like. Furthermore, after forming the lower polysilicon layer 130, it is preferable that the lower polysilicon layer 130 is patterned to form a lower polysilicon pattern (not shown) parallel with the active region 115.

As described in the Background of the Invention, the capping insulation layer is a material layer used as an etch mask, instead of the photoresist layer used when patterning the gate conductive layer 170. Accordingly, a thickness of the capping insulation layer is determined in consideration of not only a thickness of the gate conductive layer 170, but also an etch recipe for etching the gate conductive layer 170. In the case of a conventional nonvolatile memory device, the capping insulation layer is formed to a thickness of about 2000 Å. The capping insulation layer is preferably a silicon oxide layer.

Thereafter, a first photoresist pattern (not shown) is formed on the capping insulation layer across the active region 115 and the device isolation layer pattern 110. By using the first photoresist pattern as an etch mask, the capping insulation layer is patterned to form a capping pattern 180 that crosses the active region 115 and the device isolation layer pattern 110. After forming the capping pattern 180, the first photoresist pattern is removed. Meanwhile, the capping insulation layer may further comprise an anti-reflecting layer composed of silicon oxynitride to minimize scattered reflection during photolithography for forming the photoresist pattern.

Referring again to FIGS. 5 and 10A through 10C, the gate conductive layer 170 is patterned by using the capping pattern 180 as an etch mask until the gate oxide layer 120 and the device isolation layer pattern 110 are exposed. Thus, a gate electrode 175 is formed under the capping pattern 180. When patterning the gate electrode 175, the capping pattern 180 used as the etch mask may be recessed so as to be thinner than an initially stacked thickness.

The gate electrode 175 and the capping pattern 180, which are sequentially stacked across the device isolation layer pattern 110 and the active region 115, constitute a gate pattern 190 of the semiconductor device. In addition, in the case of a cell transistor for a nonvolatile memory device, the gate electrode 175 comprises the floating electrode 135, the gate interlayer insulation layer pattern 145, the lower control electrode 155, and the upper control electrode 165, which are sequentially stacked.

Preferably, the patterning for forming the gate electrode 175 employs an anisotropic etch process using an etch recipe having an etch selectivity with respect to the gate oxide layer 120 as well as the device isolation layer pattern 110. Meanwhile, to cure etching damages of the gate pattern 190 due to the anisotropic etch process, annealing may be additionally performed after forming the gate electrode 175.

By using the gate pattern 190 as a mask, low-concentration impurity ions may be implanted to turn the junction region of the cell transistor into an LDD (lightly doped drain) structure. A gate spacer (not shown) may be additionally formed on a sidewall of the gate pattern 190. The gate spacer is preferably a silicon nitride layer.

Referring to FIGS. 6 and 11A through 11C, a second photoresist layer (not shown) is formed on an entire surface of the semiconductor substrate including the gate pattern 190. The second photoresist layer is patterned to form a second photoresist pattern 200 having first and second openings 205 and 206.

Figure 6:
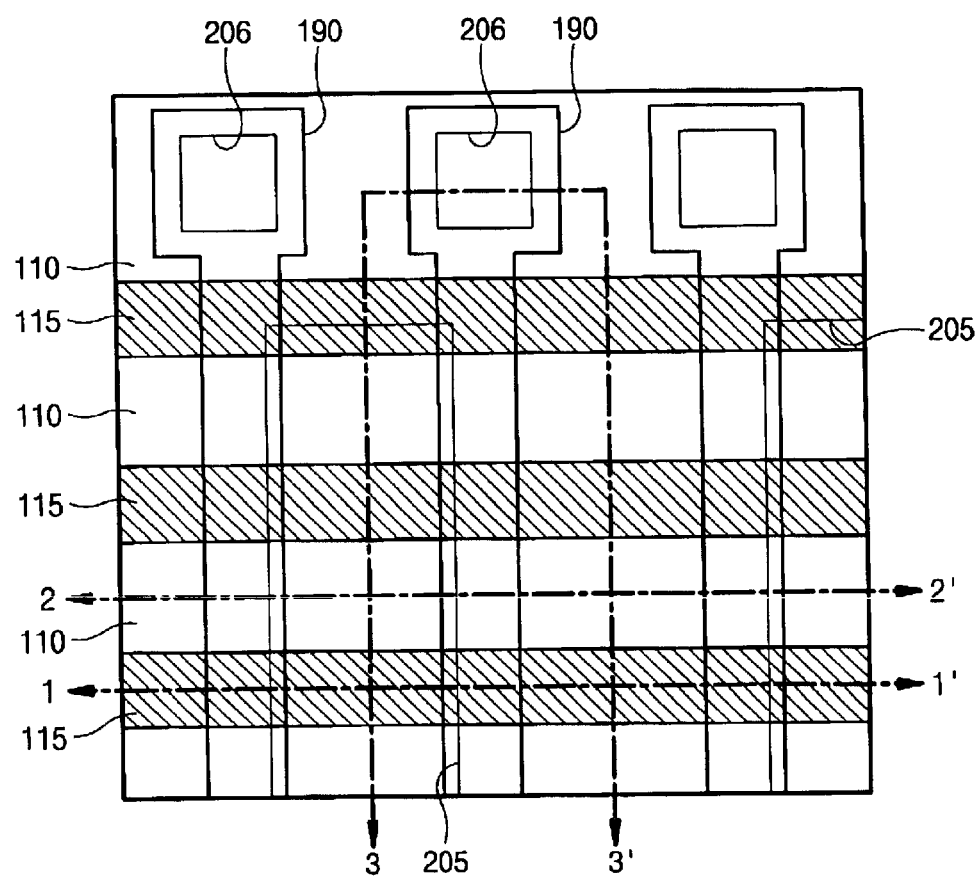

At this time, the first opening 205 is an opening of a mask pattern for forming a common source line in which a plurality of sources disposed at one side of a single gate pattern 190 are connected to a common impurity region. Accordingly, as shown in FIG. 6, the first opening 205 exposes top surfaces of the gate oxide layer 120 and the device isolation layer pattern 110 between the two adjacent gate patterns 190. It is preferable that the first opening 205 is formed to have a larger width than a space between the two adjacent gate patterns 190 such that sidewalls of the first opening 205 are disposed on the two adjacent gate patterns 190. This makes it possible to minimize problems caused by a misalignment of the photolithography for forming the second photoresist pattern 200. In subsequent processes, the common source line is formed in the region exposed through the first opening 205, whereas a drain junction region is formed in the active region in which the first opening 205 is not formed and which is covered with the second photoresist pattern 200.

Figure 11A:
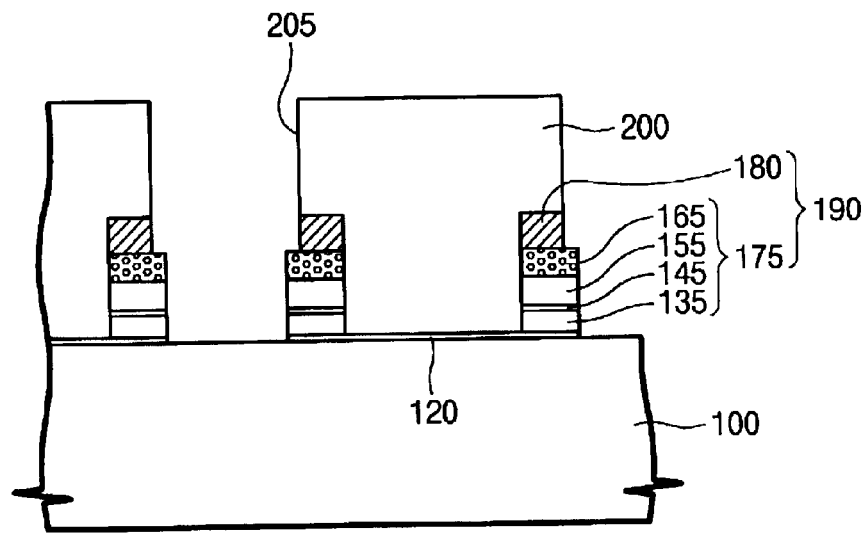
Figure 11B:
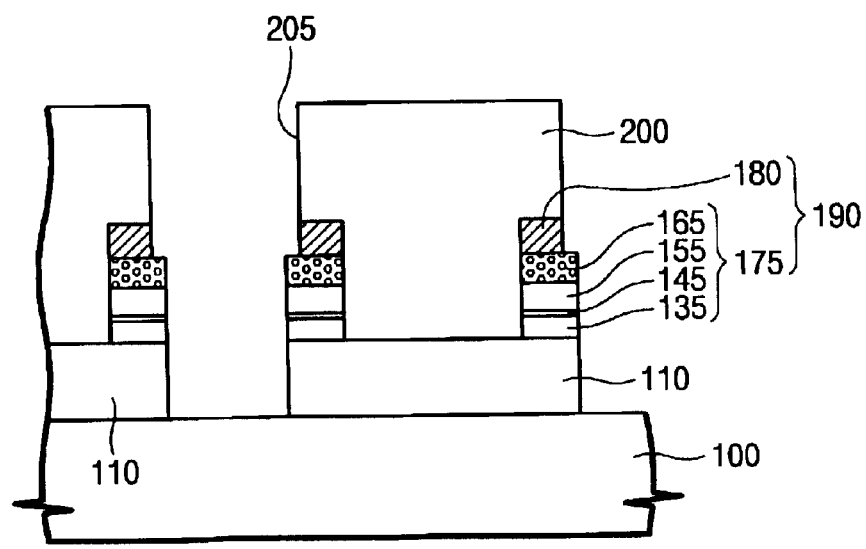
Figure 11C:
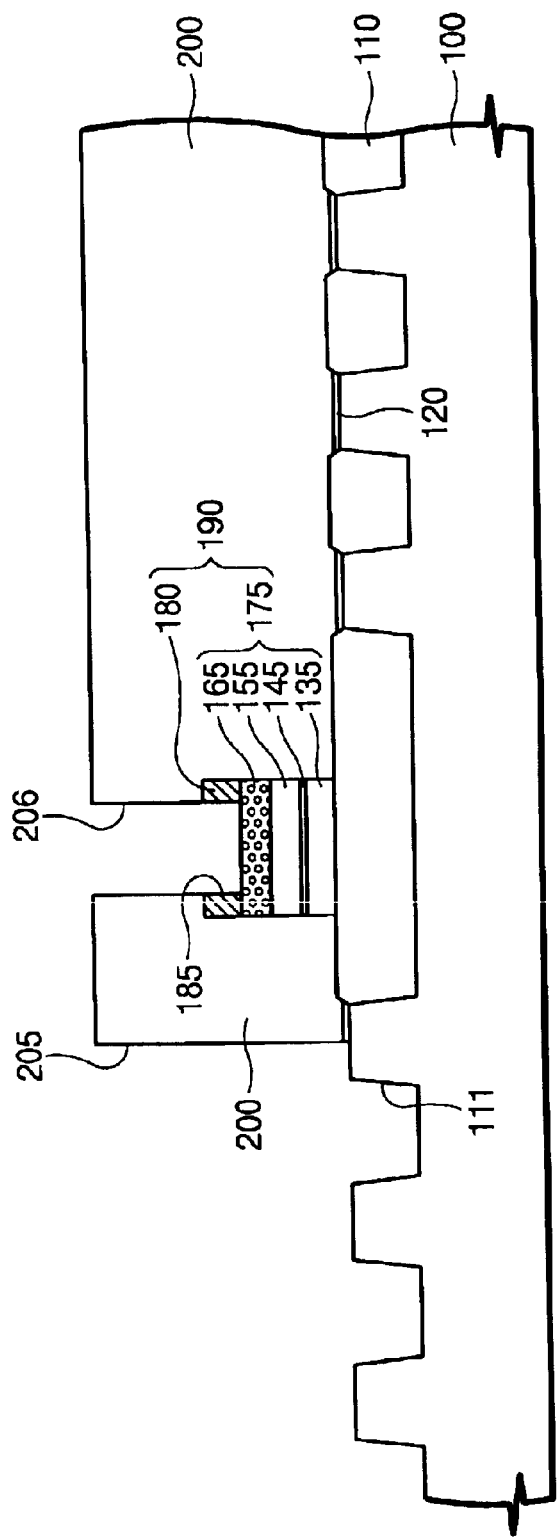
Figure 12A:
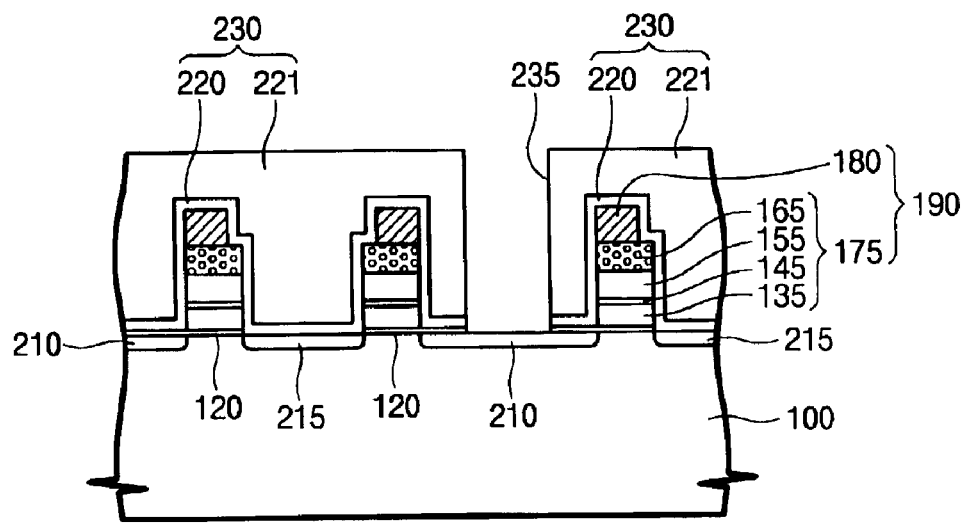
Figure 12B:
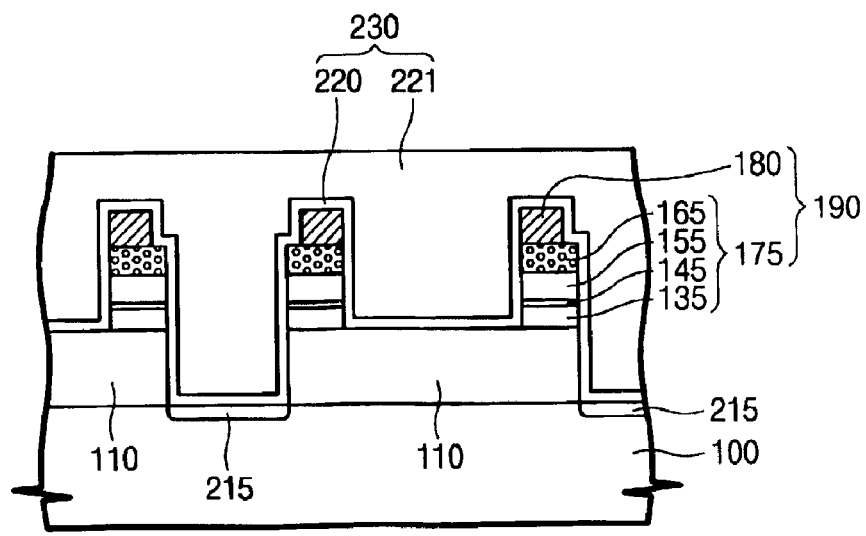
Figure 12C:
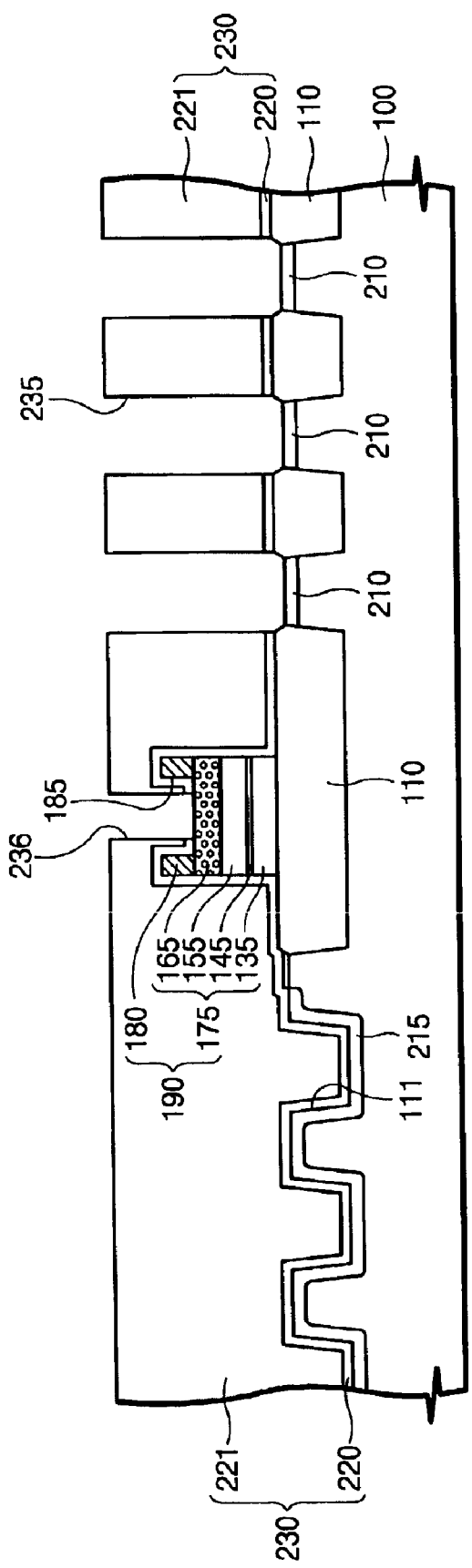
Figure 13A:
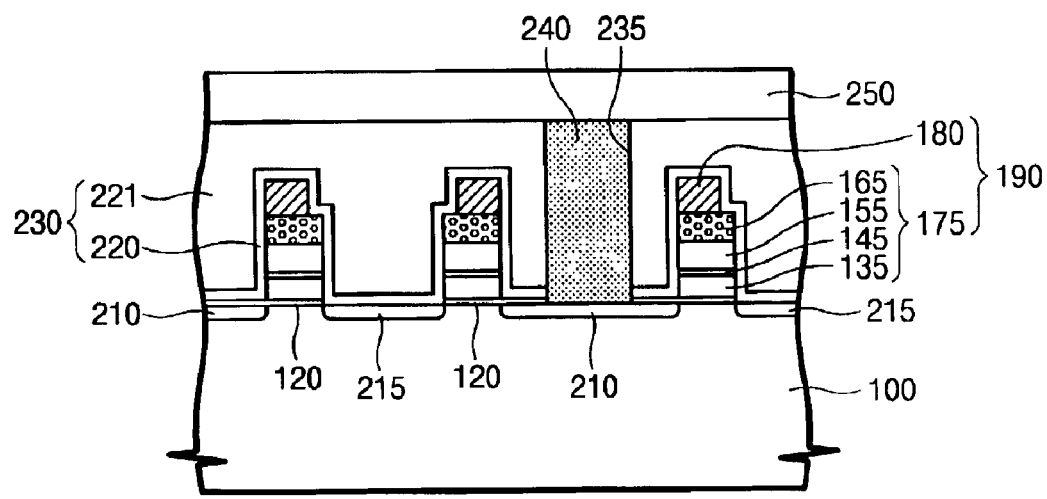
Figure 13B:
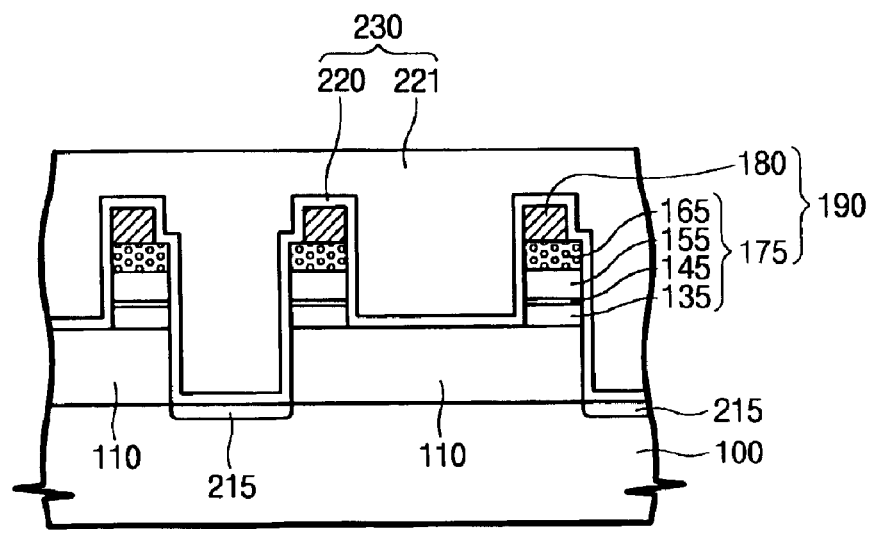
Figure 13C:
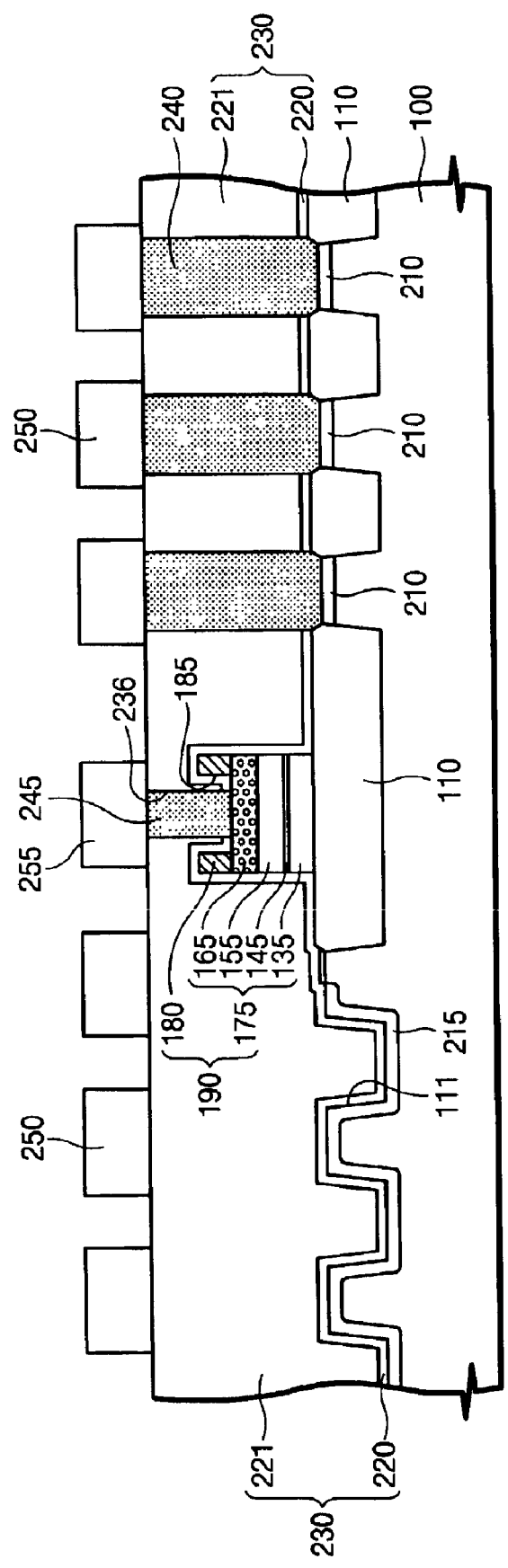

A method for forming a gate-contact structure according to a preferred embodiment of the present invention comprises etching the capping pattern 180 beforehand at the region where a gate contact hole will be formed. In this case, the second opening 206 determines a predetermined region of the capping pattern 180 that will be etched together during the subsequent etching for forming the common source line. Therefore, the second opening 206 exposes the top surface of the gate pattern 190, that is, the top surface of the capping pattern 180, at the region where the gate contact hole will be formed. Generally, the second opening 206 is preferably disposed on an endpoint of the gate pattern 190, as shown in FIG. 11C.

Thereafter, to form the common source line as described above, the device isolation layer pattern 110 exposed through the first opening 205 is etched by an anisotropic etch process using a recipe for etching a silicon oxide layer. It is preferable that the recipe for etching the silicon oxide layer has an etch selectivity with respect to the semiconductor substrate 100 as well as the gate electrode 175. Thus, the gate oxide layer 120 and the device isolation layer pattern 110, which are exposed through the first opening 205, are etched to expose the top surface of the active region 115 as well as an inner wall of the trench 111.

At the same time, the capping pattern 180 exposed through the second opening 206 is etched using the same anisotropic etch process to form a first gate contact hole 185 therein. Thus, the first gate contact hole 185 is formed in the capping pattern 180 to expose the top surface of the gate electrode 175.

Next, the second photoresist pattern 200 is removed to expose not only the gate pattern 190, but also the semiconductor substrate 100 and the device isolation layer pattern 110 that are adjacent to the gate pattern 190.

Referring to FIGS. 7 and 12A through 12C, by using the gate pattern 190 and the device isolation layer pattern 110 as an ion implantation mask, impurity ions are implanted into the semiconductor substrate from which the second photoresist pattern 200 is removed. Thus, a common source junction region 215 is formed in an upper portion of the active region 115 and in the inner wall of the trench 111, which are exposed through the first opening 205. In addition, a drain junction region 210 is formed in the active region 115 that is covered with the second photoresist pattern 200. The drain junction region 210 is formed at the opposite side of the common source junction region 215 on the basis of the gate pattern 190.

An interlayer insulation layer is formed on an entire surface of the semiconductor substrate including the common source junction region 215 and the drain junction region 210. Thereafter, the interlayer insulation layer is patterned to form an interlayer insulation layer pattern 230 having a junction region contact hole 235 and a second gate contact hole 236.

The interlayer insulation layer pattern 230 is preferably formed of first and second insulation layer patterns 220 and 221, which are sequentially stacked. The first insulation layer pattern 220 is preferably used as an etch stop layer for preventing the device isolation layer pattern 110 from being etched during etching for forming the second insulation layer pattern 221. In addition, the second insulation layer pattern 221 is a material layer that not only planarizes a top surface of the structure resulting from the foregoing steps, but also electrically insulates each of the transistors. Accordingly, the second insulation layer pattern 221 is preferably a silicon oxide layer, while the first insulation layer pattern 220 is preferably a material layer having an etch selectivity with respect to the second insulation layer pattern 221. It is preferable that the first insulation layer pattern 220 is a silicon nitride layer, a silicon oxynitride layer, or both.

Figure 7:
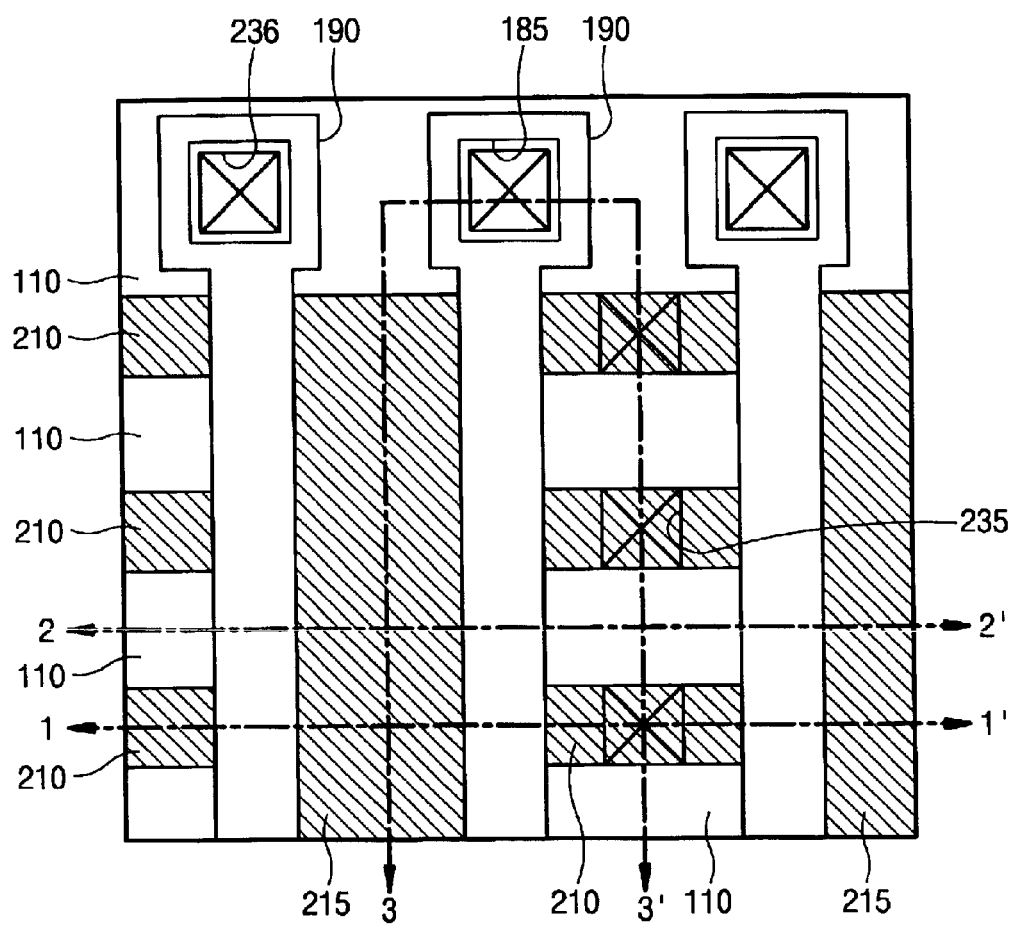
Figure 8:
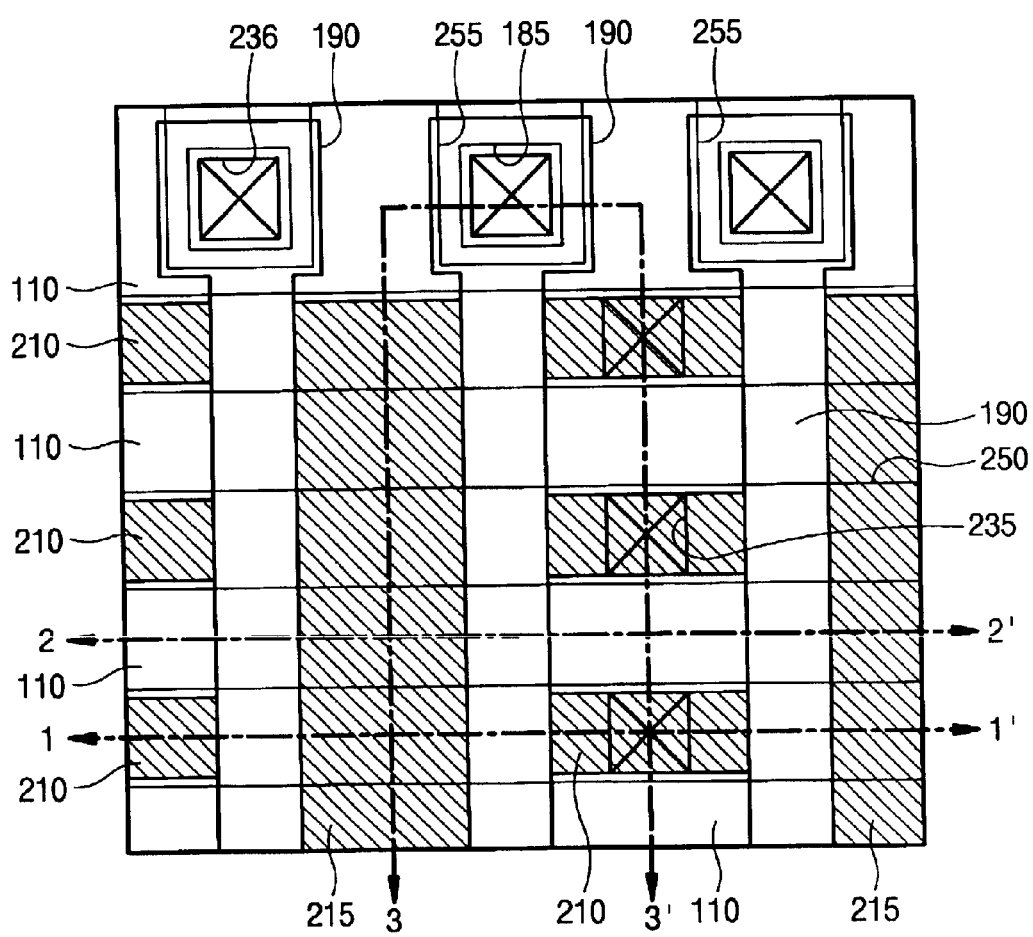
Figure 9A:
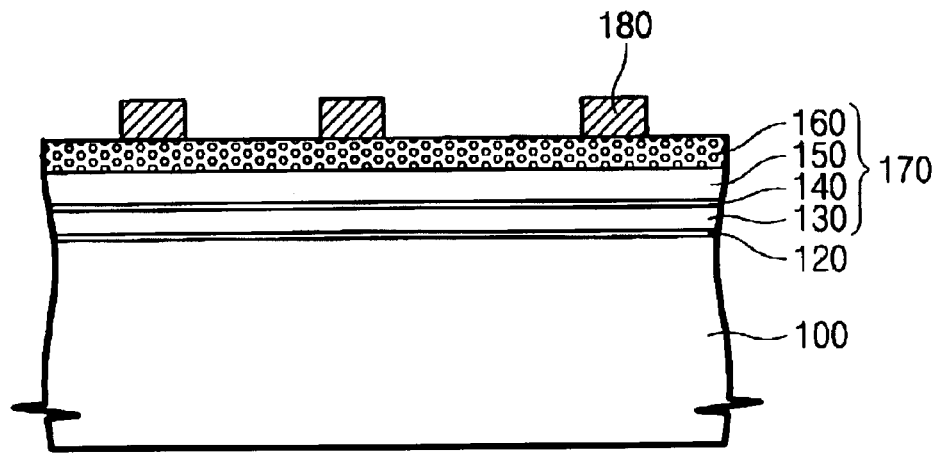
Figure 9B:
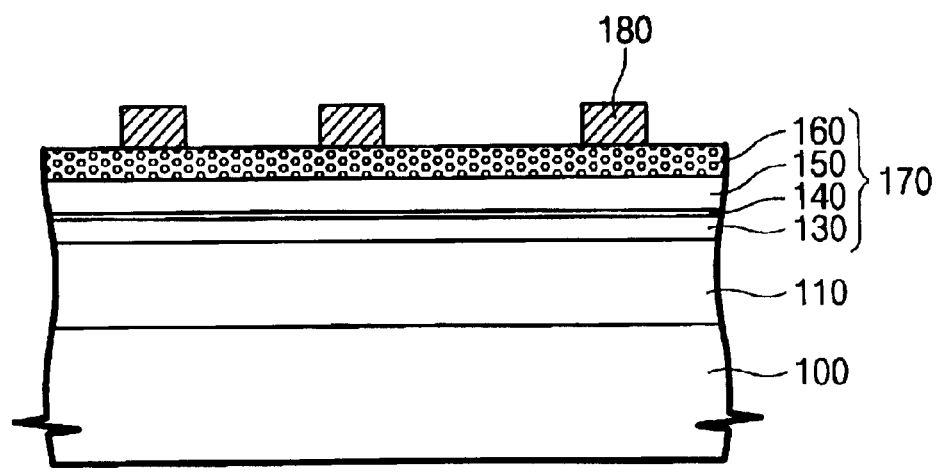
Figure 9C:
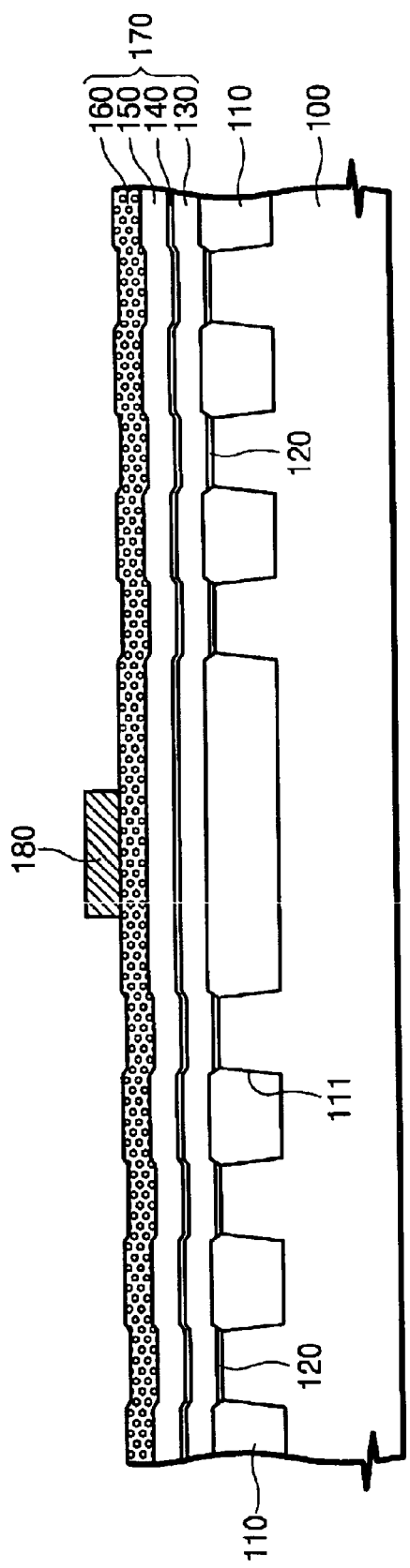
Figure 10A:
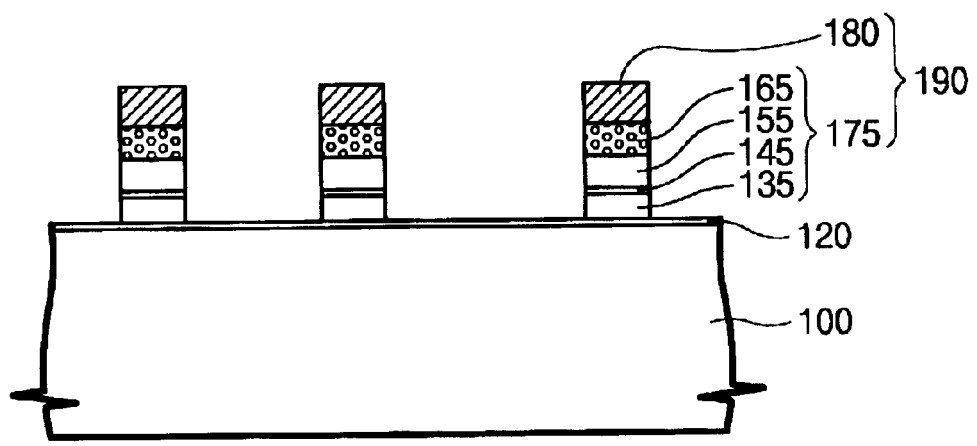
Figure 10B:
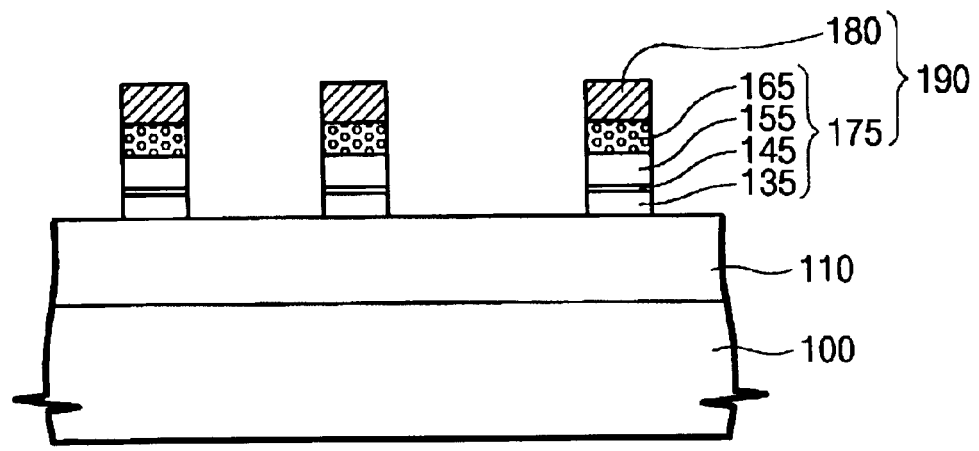

Preferably, the junction region contact hole 235 is, as shown in FIG. 7, is formed to expose the respective top surfaces of a plurality of the drain junction regions 210. Although not shown in the drawings, the junction region contact hole 235 may be formed to expose the top surface of the common source junction region 215.

Meanwhile, the second gate contact hole 236 is formed to penetrate an inside of the first gate contact hole 185, thereby exposing the top surface of the gate electrode 175. That is, the second gate contact hole 236 is formed to have a smaller width than the first gate contact hole 185.

Referring to FIGS. 8 and 13A through 13C, a contact conductive layer is formed on an entire surface of the semiconductor substrate including the interlayer insulation layer pattern 230. The contact conductive layer is then etched using a planarizing etch process until a top surface of the interlayer insulation layer pattern 230 is exposed. Thus, a gate contact plug 245 and a junction contact plug 240 are formed to fill the second gate contact hole 236 and the junction region contact hole 235, respectively.

After forming an interconnection conductive layer on an entire surface of the semiconductor substrate including the contact conductive layer patterns 240 and 245, the interconnection conductive layer is patterned to form a bit line 250 and a gate interconnection 255, which are connected to the junction contact plug 240 and the gate contact plug 245, respectively. Thus, the bit line 250 is electrically connected to the drain junction region 210, while the gate interconnection 255 is electrically connected to the gate electrode 175.

Figure 14:
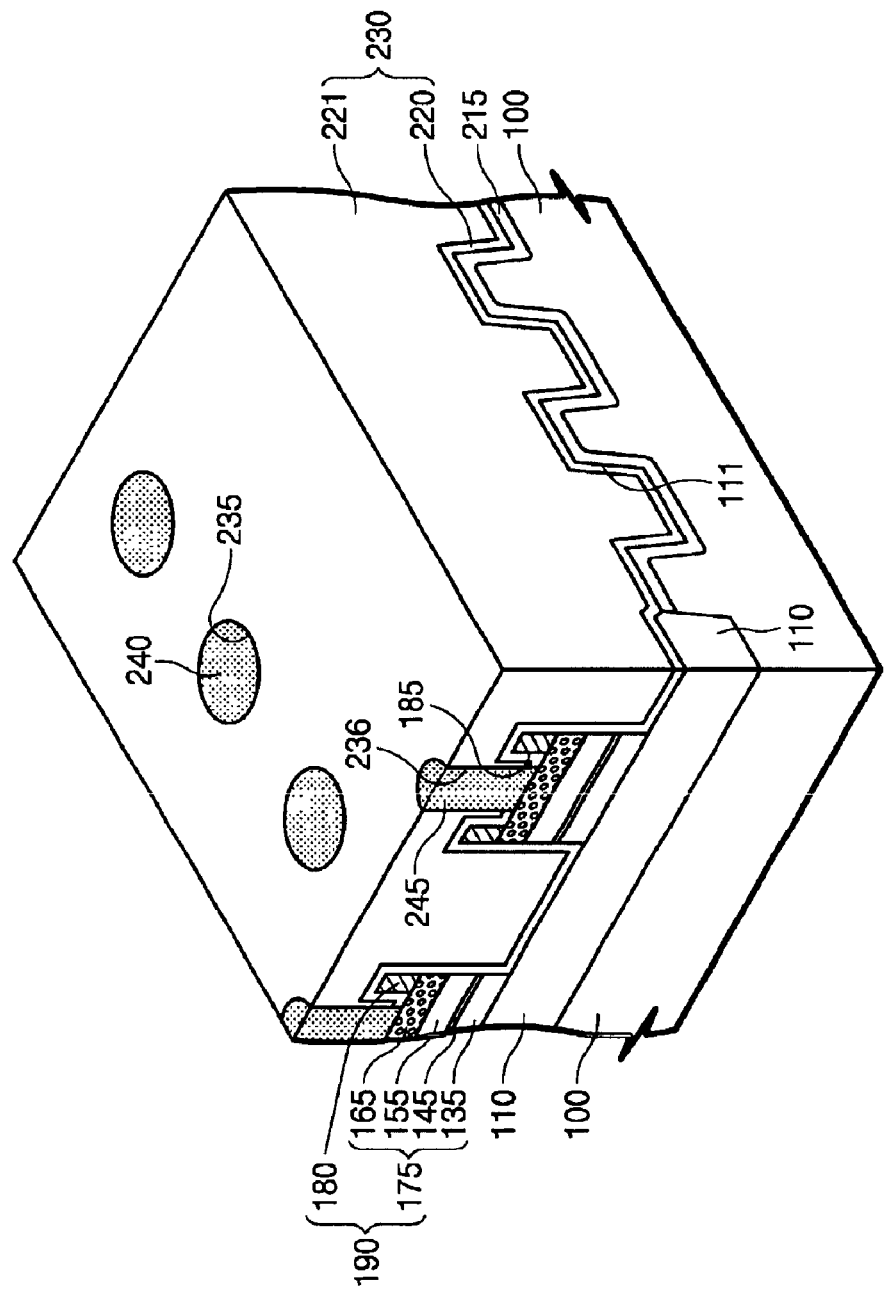
FIG. 14 is a perspective view showing the gate-contact structure according to a preferred embodiment of the present invention.

FIG. 14 is a perspective view of the NOR-type nonvolatile memory device according to the preferred embodiment of the present invention.

Referring to FIG. 14, a plurality of device isolation layer patterns 110 are disposed at a semiconductor substrate 100 to define an active region. The device isolation layer patterns 110 are preferably silicon oxide layers.

A gate pattern 190 is disposed on the semiconductor substrate where the device isolation layer pattern 110 is formed, to cross the active region and the device isolation layer pattern 110. The gate pattern 190 is formed of a gate electrode 175 and a capping pattern 180, which are sequentially stacked. A gate oxide layer (not shown) is additionally disposed between the gate pattern 190 and the active region.

Preferably, the capping pattern 180 is a silicon oxide layer and the gate electrode 175 is a multi-layered conductive material layer including polysilicon. Especially in the nonvolatile memory device, the gate electrode 175 preferably comprises a floating electrode 135, a gate interlayer insulation layer pattern 145, a lower control electrode 155, and an upper control electrode 165, which are sequentially stacked. At this time, the floating electrode 135 and the lower control electrode 155 are preferably made of polysilicon, whereas the upper control electrode 165 is preferably made of silicide. In addition, the gate interlayer insulation layer pattern 145 is preferably made of oxide-nitride-oxide (ONO).

A first gate contact hole 185 is formed in the capping pattern 180 to expose a top surface of the gate electrode 175. The first gate contact hole 185 is a structure for applying an operating voltage to the gate electrode 175, and preferably disposed on an endpoint of the gate pattern 190.

An interlayer insulation layer pattern 230, which comprises a second contact hole and a junction region contact hole 235, is disposed on the semiconductor substrate including the gate pattern 190. The second gate contact hole 236 is formed to penetrate the first gate contact hole 185 formed in the capping pattern 180. The junction region contact hole 235 exposes the top surface of the active region disposed at one side of the gate pattern 190. A drain junction region (not shown) is disposed in the active region exposed through the junction region contact hole 235.

The second gate contact hole 236 and the junction region contact hole 235 are filled with a gate contact plug 245 and a junction contact plug 240, respectively. Thus, the interlayer insulation layer pattern 230 is intervened between a sidewall of the gate contact plug 245 and a sidewall of the capping pattern 180. In addition, the junction contact plug 240 is connected to the drain junction region exposed through the junction region contact hole 235.

As described above, while the drain junction region is disposed in the active region of one side of the gate pattern 190, a source junction region is formed in the active region of the other side of the gate pattern 190: The source junction region preferably constitutes the common source junction region 215. The common source junction region 215 is an impurity region that is formed on both the active regions of one side of the gate pattern 190 and the semiconductor substrate 100 in between. A plurality of transistors are formed at a region where the gate patterns 190 intersect the active regions, and the common source junction region 215 is a common source of these transistors. By comparison, since the drain junction region is formed in the active region surrounded by the device isolation layer pattern 110 and the gate pattern 190, the number of the drain junction regions is the same as that of the transistors. That is, each transistor has its own drain junction region.

The interlayer insulation layer pattern 230 is preferably formed of first and second insulation layer patterns 220 and 221, which are sequentially stacked. The second insulation layer pattern 221 planarizes a top surface of the semiconductor substrate where the gate pattern 190 is formed, and also insulates the respective gate patterns 190. Thus, the second insulation layer pattern 221 is preferably a silicon oxide layer. In addition, since the first insulation layer pattern 220 is used as an etch stop layer, the first insulation layer pattern 220 is preferably a material layer having an etch selectivity with respect to the second insulation layer pattern 221. Thus, the first insulation layer pattern 220 is preferably a silicon nitride layer or a silicon oxynitride layer.

According to the present invention, before patterning for forming the gate contact hole, the capping pattern of the region where the gate contact hole will be formed is etched beforehand. Thus, the junction region or the device isolation layer pattern can be protected from being recessed while etching of the interlayer insulation layer occurs. As a result, a semiconductor device can be fabricated that minimizes a leakage current in the junction region.

What is claimed is:

1. A gate-contact structure comprising:
   a device isolation layer pattern at a semiconductor substrate, the device isolation layer pattern defining an active region;
   a gate electrode on the semiconductor substrate, the gate electrode crossing the device isolation layer pattern and the active region;
   a capping pattern on the gate electrode, the capping pattern having a first gate contact hole that exposes a predetermined region of the gate electrode;
   an interlayer insulation layer pattern covering the gate electrode and the capping pattern, the interlayer insulation layer pattern having a second gate contact hole that penetrates the first gate contact hole to expose a top surface of the gate electrode, the second gate contact hole having a width that is less than a width of the first gate contact hole; and
   a gate contact plug connected to the top surface of the gate electrode through the second gate contact hole.

2. The structure as claimed in claim 1, wherein the interlayer insulation layer pattern is intervened between the gate contact plug and a sidewall of the capping pattern.

3. The structure as claimed in claim 1, wherein the interlayer insulation layer pattern is formed of first and second insulation layer patterns.

4. The structure as claimed in claim 3, wherein the first insulation layer pattern is a material layer having an etch selectivity with respect to the second insulation layer pattern.

5. The structure as claimed in claim 3, wherein the second insulation layer pattern is a silicon oxide layer.

6. The structure as claimed in claim 1, wherein a common source junction region is disposed at one side of the gate electrode.

7. The structure as claimed in claim 1, wherein the gate electrode is a gate electrode of a nonvolatile memory device that comprises a floating electrode, a gate interlayer insulation layer pattern, a lower control electrode, and an upper control electrode, which are sequentially stacked.

8. A gate-contact structure comprising:
   a device isolation layer pattern at a semiconductor substrate, the device isolation layer pattern defining an active region;
   a gate electrode on the semiconductor substrate, the gate electrode crossing the device isolation layer pattern and the active region;
   a capping pattern on the gate electrode, the capping pattern having a first gate contact hole that exposes a predetermined region of the gate electrode;
   an interlayer insulation layer pattern covering the gate electrode and the capping pattern, the interlayer insulation layer pattern having a second gate contact hole that penetrates the first gate contact hole to expose a top surface of the gate electrode; and
   a gate contact plug connected to the top surface of the gate electrode through the second gate contact hole, the interlayer insulation layer pattern intervened between the gate contact plug and a sidewall of the capping pattern.

* * * * *